US011596078B2

(12) United States Patent
Dallaserra et al.

(10) Patent No.: US 11,596,078 B2
(45) Date of Patent: Feb. 28, 2023

(54) SYSTEM AND METHOD FOR CONNECTING AT LEAST ONE ELECTRONIC CARD TO A PRINTED CIRCUIT BOARD

(71) Applicant: BULL SAS

(72) Inventors: Luc Dallaserra, Paris (FR); Jithendra Bangera, Bangalore (IN)

(73) Assignee: BULL SAS, Les Clay-sous-Bois (FR)

( * ) Notice: Subject to any disclaimer, the term of this patent is extended or adjusted under 35 U.S.C. 154(b) by 170 days.

(21) Appl. No.: 16/956,635

(22) PCT Filed: Dec. 22, 2017

(86) PCT No.: PCT/IB2017/001756
§ 371 (c)(1),
(2) Date: Jun. 22, 2020

(87) PCT Pub. No.: WO2019/122948
PCT Pub. Date: Jun. 27, 2019

(65) Prior Publication Data
US 2021/0100123 A1   Apr. 1, 2021

(51) Int. Cl.
*H05K 7/14*   (2006.01)
(52) U.S. Cl.
CPC ......... *H05K 7/1435* (2013.01); *H05K 7/1429* (2013.01); *H05K 7/1487* (2013.01)
(58) Field of Classification Search
CPC ... H05K 7/1435; H05K 7/1429; H05K 7/1487
See application file for complete search history.

(56) References Cited

U.S. PATENT DOCUMENTS

| 5,425,169 | A  | * | 6/1995  | Steinman | H01R 13/62933 29/758 |
| 7,077,679 | B1 | * | 7/2006  | Szuba    | G06F 1/185 439/507 |
| 9,766,667 | B1 | * | 9/2017  | Singer   | G06F 1/185 |
| 9,826,658 | B1 | * | 11/2017 | Mao      | G06F 1/183 |

(Continued)

OTHER PUBLICATIONS

International Search Report of the International Searching Authority for PCT/IB2017/001756 dated Aug. 22, 2018.

*Primary Examiner* — Abhishek M Rathod
*Assistant Examiner* — Keith DePew
(74) *Attorney, Agent, or Firm* — Meagher Emanuel Laks Goldberg & Liao, LLP

(57) ABSTRACT

Disclosed is a system and a method for connecting at least one electronic card to an electronic board of a computer device, the system including an electronic board, equipped with a plurality of connectors for connecting at least one electronic cards to the electronic board, and slots for connecting at least one component to the electronic board. The at least one electronic card are substantially perpendicular to the electronic board. The system further includes a first supporting means being configured such that the at least one electronic card is first mounted onto the first support before the first support is placed above the electronic board in the vertical direction. The system further includes a second support installed underneath the electronic board in the vertical direction. The system includes further ejection mechanism and insertion mechanism. The system for connecting may include a plurality of electronic boards.

25 Claims, 13 Drawing Sheets

(56) References Cited

U.S. PATENT DOCUMENTS

| | | | |
|---|---|---|---|
| 10,624,226 B1* | 4/2020 | Alvarado | H05K 7/1408 |
| 2005/0215107 A1* | 9/2005 | Castello | H05K 7/1454 |
| | | | 439/378 |
| 2005/0270298 A1* | 12/2005 | Thieret | G06F 13/409 |
| | | | 345/502 |
| 2009/0103273 A1* | 4/2009 | Costello | H05K 7/142 |
| | | | 361/756 |
| 2017/0196107 A1* | 7/2017 | Chen | H05K 7/1417 |

* cited by examiner

SYSTEM AND METHOD FOR CONNECTING AT LEAST ONE ELECTRONIC CARD TO A PRINTED CIRCUIT BOARD

FIELD OF THE INVENTION

The invention relates to a system for connecting at least one electronic card to an electronic board. The invention in particular, relates to a system for connecting a variety of electronic cards to a motherboard in a server.

BACKGROUND OF THE INVENTION

For computer device, such as computer servers, there is an occasional need to have a quick access to the top of the motherboard in order to easily replace equipment of the motherboard such as CPUs and memories. For example, this may require the disconnection of the electronic cards being already inserted onto the connectors of the motherboard.

It is known that the electronic cards may be of various types, and being inserted in different orientations onto the motherboard. For example, the electronic cards may be vertical cards such as power supply cards and riser cards, the latter being often used to allow adding expansion cards to a server of low-profile case where the height of the case does not allow for perpendicular placement of the full-height expansion card; and may be expansion cards or adaptor cards disposed perpendicular to the riser card i.e. parallel to the motherboard.

Consequently, plugging these cards to the motherboard in different orientations and removing them might cause several issues, such as time-consuming particularly at the moment of accessing the mother board. Besides that, incorrectly seated electrical card may even cause damage to the mother board and the card.

The prior art has proposed a solution to solve this problem by using a backplane system, where the backplane is usually installed at the back of the server, being perpendicular to the motherboard and connectable with the latter by cables (shown as "external connection" in shadowed blocks in FIG. 1). The backplane solution in particular, proposes using the same rear area of the backplane to create "internal connections" shown in non-shadowed blocks between a card and a motherboard in FIG. 1 to connect the cards to the motherboard via the intermediate connection with the backplane. In this way, a variety of electronic cards 18 may be connected/disconnected with the motherboard via the backplane separately from any direct access to the motherboard, thus delivering a faster and more precise connection than the individual operation of electronic cards.

However, there are some important drawbacks in this solution.

First, as the surface of the rear panel where situated the backplane is limited due to design considerations for density optimization, the further occupation of the rear area for usage of internal connections apart from the external connections (respective wiring area) would inevitably reduce the clearance at the rear area normally reserved for air flow (shown in FIG. 1 as a hollow left arrow), which is necessary for the cooling of the electronic components of the servers. In other words, as air flow is oriented front-rear, and the backplane is perpendicular to the motherboard, the blockage of air flow by the backplane may undesirably increase the temperature of the components.

It follows that the combination of the number of external connection and internal connection in the backplane system is not space-wise, and is not compatible with the space available, thus bringing complexity to the thermal solution of the system.

Besides, the usage of a backplane system may cause a longer signal routing and higher cost, as the backplane for high-speed signal is expensive.

Another major drawback of the previous solution relates to the cabling connection adopted by the backplane system solution. Where the expansion cards are connected to the mother board by several cables, in case of replacing the malfunctioning card with a good one, this may add chances for the cable to be incorrectly connected or even misplaced during the service. Where the expansion cards are connected together, it is then necessary to disconnect all the cards to have a complete access to the motherboard, which may require more time at the customer site to change any component on the motherboard.

Therefore, there is a need for computer device that allows quick access to the top of the motherboard without having the deficiencies identified in the previous solutions.

SUMMARY OF THE INVENTION

The aim of the present invention is to provide a technical solution allowing quick access to the motherboard.

This object is achieved with a system for connecting at least one electronic card to an electronic board of a computer device, wherein the computer device comprises:
an electronic board, equipped with a plurality of connectors for connecting at least one vertical card to the electronic board, said at least one vertical card being substantially perpendicular to the electronic board, and slots for connecting at least one components to the electronic board, the electronic board being connectable with a backplane system by cabling connections, The at least one electronic card are substantially perpendicular to the electronic board. The computer device further comprises a system for connecting which allows the at least one electronic card to be connected to the electronic board simultaneously via the system for connecting.

In some embodiments, the system for connecting comprises a first supporting means that allows to first mount the at least one electronic card onto the first supporting means, before the first supporting means is placed above the electronic board in the vertical direction, in order to connect the at least one electronic card to the electronic board. The system for connecting further comprises a second supporting means installed underneath the electronic board in the vertical direction.

The use of the first supporting means allows to connect the at least one electronic card to the electronic board by placing such a supporting means mounted with at least one card onto the electronic board in vertical direction. Such use of the first supporting means is advantageous in that by performing one simultaneous insertion in the vertical connection, the present solution not only saves space in certain dimension to be used for the passage of airflow but also provides an easier and simultaneous manner of connection.

This is particularly advantageous in view of widening the range of applications based on the inserted electronic cards (vertical cards). For example, further electronic components such as hard disks or graphic cards may be plugged directly onto the vertical cards. Furthermore, expansion cards or adaptor cards (horizontal cards) may be inserted perpendicular to the vertical card and thus be connected parallel to the motherboard. It is convenient to note that such horizontal card can be inserted to the vertical cards in a flexible manner in time before or after the vertical card is mounted to the electronic board.

The system for connecting further comprises at least one guiding means provided in mutually complementary shape, so that the at least one electronic card is guided to align with the connectors of the electronic board before the card is plugged into the connectors of the electronic board.

As it is understood by persons skilled in the art that incorrect connections of the electronic cards to the motherboard may damage both the electronic cards and the board, it is thus necessary to introduce a guiding means in the present invention that allows easier connection of the first and the second supporting means while assuring the alignment between the electronic cards and the connectors of the motherboard. The system is thus designed to allow easy connection to near-guiding device.

Further, it is desirable to introduce a floating mechanism in the present invention, which allow the electronic cards to float in the horizontal direction to self-align with the mating connectors of the motherboard thus further eliminating incorrect connections and damages.

To this end, the at least one guiding means comprises a first guiding means, comprising a guiding pin and a guiding pin housing, each being provided on the first supporting means and on the second supporting means respectively, each of the first guiding means being fixed substantially perpendicular to one of the supporting means, so that when one of the first guiding means provided on the first supporting means is aligned with the other first guiding means provided on the second supporting means, the first supporting means is aligned with the second supporting means in the horizontal direction.

In some embodiments, the at least one guiding means further comprises a second guiding means, comprising a guiding pin and guiding pin housing, one being provided on the electrical card and fixed substantially laterally to the electronic card, and the other being provided on the electronic board and being fixed substantially perpendicular to the electronic board, so that the electrical card and one of the second guiding means fixed thereto are guided to align with the electronic board, and the electronic card is aligned with the connectors of the electronic board.

In some further embodiments, the configuration of the first guiding means and the second guiding means allows the guiding pin to be engaged in the guiding pin housing of the second guiding means only after the guiding pin is engaged in the guiding pin housing of the first guiding means.

In some further embodiments, after the first guiding means is in engaged position but before the second guiding means is in engaged position, the electronic card and the second guiding means fixed thereto are free to move together in the horizontal direction (floating).

The floating movement in the horizontal direction is further implemented by comprising an opening on the first supporting means configured to let the vertical electronic card to pass through, and a bracket comprising a first part of the bracket being fixed laterally to the vertical card, and a second part of the bracket extending perpendicularly from the vertical card and after the vertical card passes through the opening and when the second part of the bracket is seated on the first supporting means, the vertical card may move with the bracket in the horizontal direction with respect to the first supporting means, while the vertical movement of second part of the bracket is blocked with respect to the first supporting means by a blocking means.

In some further embodiments, the blocking means is a shouldered screw screwed into the first supporting means, configured to allow the vertical movement of the second part of the bracket to be blocked between the head of the shouldered screw and the first supporting means.

To ease the operation of disconnecting the at least one electronic cards from the motherboard, it is desirable that the system can be operated by one operator.

To this end, the present invention proposes to provide an ejecting means on the second supporting means, being configured for lifting the first supporting means from the second supporting means.

Alternatively, the ejecting means may be provided on the first supporting means, being configured for pushing the second supporting means away from the first supporting means.

In some embodiments, the ejecting means comprises an effort reduction system, comprising a plurality of gears, at least one lever, a plurality of fingers being rigidly connected to the gears and disposed under the first supporting means, wherein the displacement of the at least one lever is greater than the course of the finger in the vertical direction so as to lift the first supporting means such that the first effort of the displacement of the levers is weaker than the second effort of the vertical movement of the fingers so as to lift the first supporting means.

It is further understood by persons skilled in the art that it is important to remain the rigidity of mechanism during the process of ejecting.

To this end, the present invention proposes to provide four gears in the ejecting means, essentially being located at the four corners of the second supporting means to ensure that the force is distributed among the 4 gears with certain stability of the ejecting means, regardless of variations of the centre of mass in view of the subsequent loading of cards onto the motherboard and thus prevent any tilting of the first supporting means during the ejection/plugging of the card.

To this end, both the first and the second supporting means are of quadrilateral shape.

In some further embodiments, the four gears are toothed gears, divided into two sets each set being located on one lateral side of the second supporting means, the two gears of each set are linked by a slider so that when one gear of each set is activated by a lever, two gears of the same set rotate simultaneously.

To avoid increasing the size of the server including the ejecting means, it is proposed a tractable lever by the present invention.

In some embodiments, the ejecting means further comprises a locking system configured to authorize the lever to be unblocked once the first supporting means is completely engaged with the second supporting means, and be locked only after the first supporting means is completely seated with the second supporting means.

In some embodiments, the locking system comprises a plunger, configured to be pulled out once the first supporting means is completely engaged with the second supporting means, allowing the lever to be unlocked, and after actuation of the lever allowing all the vertical cards to be connected with the electronic board, the plunger is configured to be blocked with the first supporting means once the first supporting means is completely seated with the second supporting means.

The computer devices of the present invention may comprise a plurality of electronic boards other than one electronic board. In this case, the system for connecting the at least one electronic card to the plurality of electronic boards is configured such that the at least one electronic card is connected to the plurality of electronic board simultaneously via the system for connecting.

Another object of the invention is to provide a method for connecting at least one electronic card to an electronic board of a computer device. The method comprises connecting the at least one electronic card to the electronic board simultaneously via the system for connecting.

In some embodiments, the method for connecting comprises the steps of:
mounting at least one electronic card onto a first supporting means, and then
placing the first supporting means above the electronic board in the vertical direction.

In some embodiments, the method comprises the step of guiding the at least one electronic card to align with the connectors of the electronic board before the card is plugged into the connectors of the electronic board.

In some embodiments, the step of guiding further comprises performing a second guiding step performed by the second guiding means after a first guiding step performed by the first guiding means.

In some further embodiments, wherein the first guiding step allows the first supporting means to be aligned with the second supporting means in the horizontal direction when the first guiding means is in engaged position, and the second guiding step allows the electronic card to be aligned with the electronic board when the second guiding means is in engaged position.

In some embodiments, the method for connecting comprises the step of moving the electronic card with respect to the electronic board in the horizontal direction after the first guiding step so that the electronic card is aligned with the mating connector.

In some embodiments, the method for connecting comprises installing a blocking means on the first supporting means after the electronic card is mounted on the first supporting means with a bracket, so that the vertical movement of the electronic card and the bracket is blocked by the blocking means.

In some embodiments, the method for connecting further comprises lifting the first supporting means from the second supporting means by an ejecting means.

In some further embodiments, the method for connecting further comprise pushing the second supporting means away from the first supporting means by an ejecting means.

Further features and advantages of the invention will appear from the following description of embodiments of the invention, given as non-limiting examples, with reference to the accompanying drawings listed hereunder.

DETAILED DESCRIPTION OF THE INVENTION

In the following detailed description of the preferred embodiments, reference is made to the accompanying drawings which form a part hereof, and in which are shown by way of illustration specific embodiments in which the invention may be practiced. It is to be understood that other embodiments may be utilized, and structural changes may be made without departing from the scope of the present invention.

In all FIGS. 1-13 the definitions of "underneath" and "above" refer to the relative positions of components provided in the vertical direction, which direction is relative to the chassis or cabinet of the server 60 installed on the ground.

Figure 1:
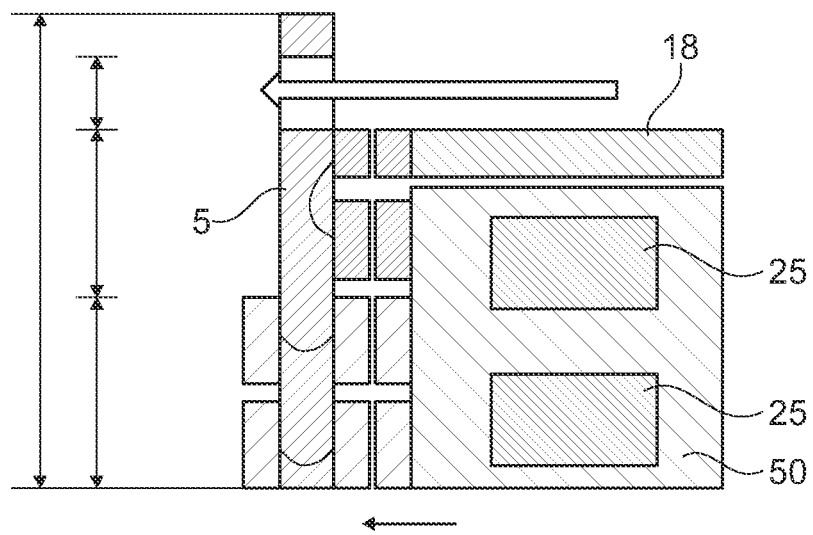
FIG. 1 schematically illustrates a backplane system for connecting at least one electronic card to an electronic board, with connections between the backplane and the motherboard as well as between the backplane and the electronic cards, according to a prior art solution.
Figure 2:
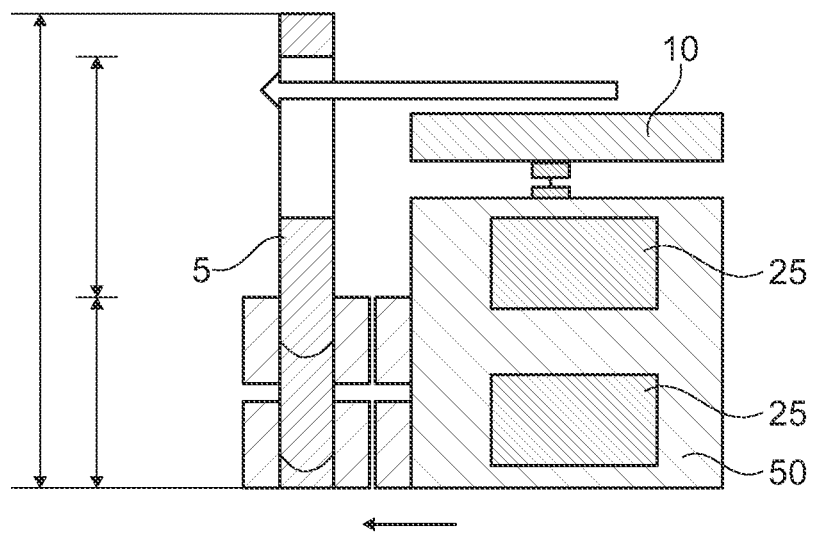
FIG. 2 schematically illustrates a system for connecting at least one vertical card to an electronic board according to one embodiment of the present invention.

Referring generally to FIG. 2 illustrating a system for connecting at least one electronic card to an electronic board according to one embodiment of the present invention. Similar to FIG. 1, the system comprises a motherboard 50 with CPU and memories 25, and an electronic card 10 to be connected to the motherboard 50. The motherboard 50 can be connected to a backplane system 5 by cabling connections (shown in shadowed blocks, same as the "external connections" in FIG. 1) as known in the prior art.

The electronic card is perpendicular to the motherboard and will be referred to as "vertical card" 10 thereafter.

Such vertical cards may have a wide range of applications in the industry of computer servers, for example, the vertical cards may be electronic cards such as power supply cards or riser cards, the latter being often used to allow adding expansion cards or adaptor cards being disposed perpendicularly to the vertical card thus being parallel to the motherboard to a server of low-profile case where the height of the case does not allow for perpendicular placement of the full-height expansion card. The vertical cards may not only be used to connect expansion cards or adaptor cards (be referred to as "horizontal card" thereafter) but also to plug electronic components such as hard disks on the vertical cards to form e.g. a disk array.

As illustrated in FIG. 2, the occupation of the backplane in the width direction is shared by space for external connections and for airflow, and is no longer shared by internal connections used for connecting the electronic card and the motherboard as shown in FIG. 1.

It is to be noted that due to limitation of the drawing, the card 10 to be connected with the motherboard 50 is shown adjacent to the upper edge of the latter in FIG. 2, but the connection is actually made in the vertical direction penetrating the picture plane. This vertical connection enabled by the present invention makes it possible to place the internal connections without constrains in the server (for example in the depth direction) and further enabling orientating the internal connection in the depth direction and will be discussed in more details in the following descriptions.

As can be seen from FIG. 2, by changing the orientation of connection, the vertical connection also provides advantages in terms of passage for airflows. The clearance at the rear of the backplane for airflow (shown as hollow left arrow in FIG. 2) is increased and would result in a more efficient cooling of the electronic components contained in the server. This feature may be particularly advantageous as the temperature of the components may greatly affect the performance of the server.

Figure 3:
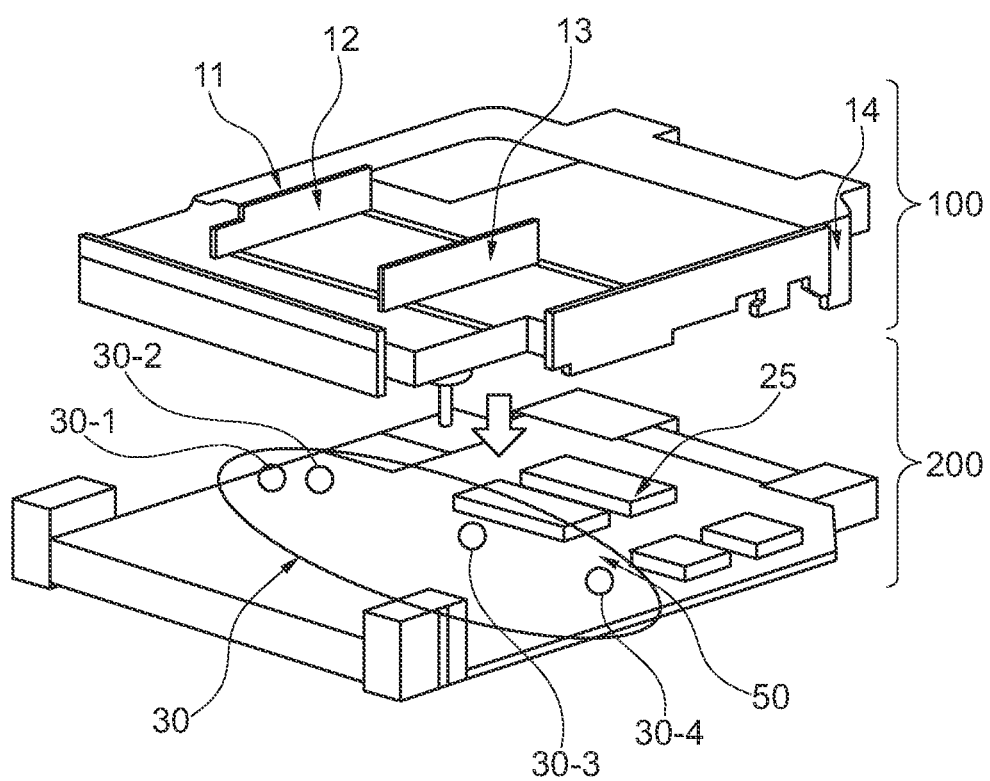
FIG. 3 is an exploded view showing the main components included in the two-tray structure (an upper tray and a lower tray) of the present invention.

FIG. 3 is an exploded view showing the main components included in a preferred embodiment of two-tray structure of the present invention.

As shown in FIG. 3, the server 60 of the present invention may comprise in general a first supporting means 100 and a second support means 200 in the form of an upper tray and a lower tray respectively. The lower tray is situated underneath the upper tray in the vertical direction. In some embodiments, in order to connect several vertical cards 10 to the motherboard 50, tray 2 which is plugged with cards e.g. 11-14 will be placed onto the motherboard 50 disposed onto the lower tray 200. In an exemplary embodiment, the cards 11-14 may be guided to be inserted into respective connectors on the motherboard 50, which will be explained further blow.

The upper tray assembly, shown as being above the lower tray assembly in the vertical direction, comprises four vertical cards 11-14. In some embodiments, the vertical cards 11 and 14 are power supply cards plugged in the edge and corner of the upper tray 100, and the vertical cards 12 and 13 are PCIe riser cards located in the middle of the upper tray 100. The vertical cards are not limited in its number or type to this example, and can be plugged in any position on the upper tray 100 corresponding to the positions of the mating connectors 30 on the motherboard regardless of the centre of mass, which will be explained in more details in the descriptions in relation to the ejection mechanism. The upper tray 100 assembly further comprises brackets and guiding means (not shown), which will be explained later with reference to FIGS. 6A-6C.

The lower tray assembly having the motherboard 50 installed thereon comprises slots 24 (not shown) for connecting at least one memories 25 and mating connectors 30-1, 30-2, 30-3 and 30-4 for inserting four vertical cards namely 11, 12, 13, 14. The lower tray assembly further comprises guiding means (not shown) to be explained further with reference to FIGS. 5A-5C and FIG. 6D.

The use of upper tray 100 assembly thus allows to connect the at least one vertical card to the electronic board by placing such a tray assembly mounted with at least one card onto the electronic board in vertical direction. Taking into account of adding horizontal cards such as expansion cards or adaptor cards into the system, this may be particularly advantageous in that it provides an easier way of connecting the cards of different orientations to the board while keeping such connection in a simultaneous manner. It follows that such time-saving feature is important for achieving the goal of quick access to the to the motherboard in order to easily replace equipment of the motherboard like CPUs and memories, when removal of the cards from the motherboard was traditionally time-consuming and complicated.

Figure 4:
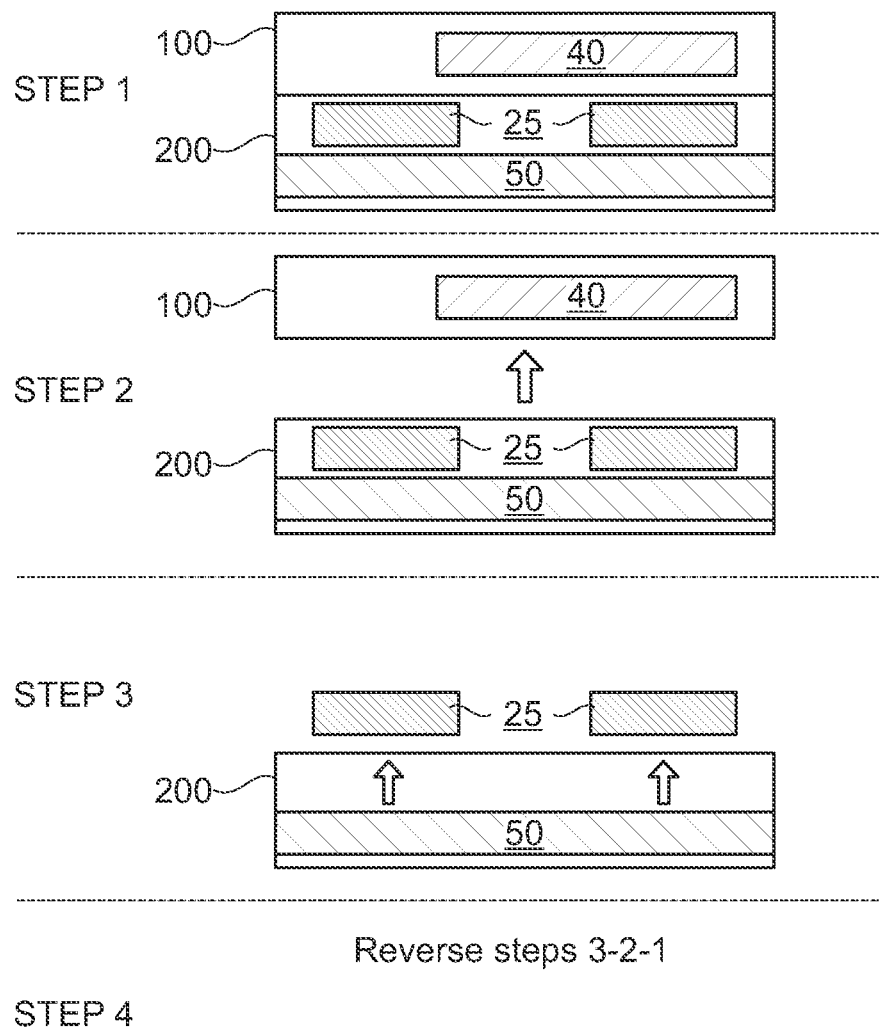
FIG. 4 schematically illustrates the principle of the present invention adopting an ejecting mechanism and an insertion mechanism.

Before describing more specifically the ejection mechanism and the insertion mechanism of the invention, explanations are provided to the general principle for having a quick access to the motherboard applying the ejection and insertion mechanisms by referring to FIG. 4.

Starting from Step 1 in FIG. 4, showing an embodiment according to the present invention where a server is extracted from the cabinet or chassis comprises. The server comprises two trays one being superposed on the other, with the upper tray 100 being mounted with optional equipment 40 and the lower tray 200 carrying the motherboard being mounted with memories and CPUs 25. Connections between the optional equipment 40 and the motherboard are omitted in the drawing for purpose of simplicity. The optional equipment 40 may be any type of vertical cards and are not limited to those cards used in the exemplary embodiments. At Step 1, the server is extracted from the cabinet or the chassis (not shown in the drawing for purpose of simplicity).

At Step 2, the upper tray 100 together with the optional equipment 40 are ejected from the lower tray 200 by an upward movement in the vertical direction, then the upper tray 100 is put aside. This leaves free access to lower tray 200 from the top of it.

At Step 3, the goal is achieved by replacing components such as memories and/or CPUs from the top of motherboard. It is to be noted that the examples of components are not limitative and depending on the design needs, other components may be mounted to the motherboard.

At Step 4, when replacing of memories and/or CPUs is finished, the upper tray 100 can be placed back onto the lower tray 200, then the server is placed in the cabinet or chassis, all taking place as the reversed steps 3-2-1.

Further advantages brought by the insertion mechanism are now explained with reference to FIGS. 5A-5C, which are side views of the system, showing the self-alignment process for connecting at least one vertical card to an electronic board according to an embodiment of the invention.

During the process of insertion, correct connection of the vertical cards with the motherboard is desired to avoid potential damages to both the cards and the motherboard. To this end, the guiding means play important roles in enabling the present invention to align several connectors properly before inserting the cards into such connectors. The self-alignment process is now described in detail with reference to FIGS. 5A-5C.

Figure 5A:
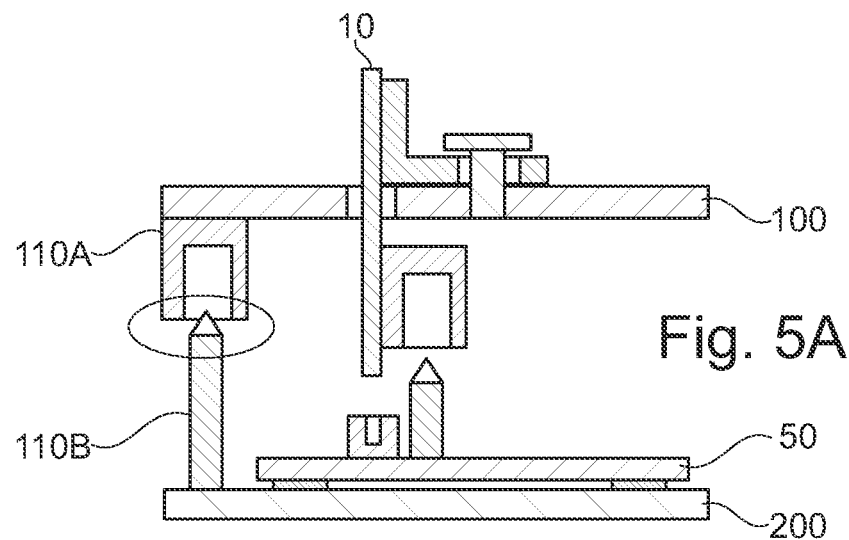
FIGS. 5A-5C are side views of the system according to the present invention, schematically showing the self-alignment process for connecting at least one vertical card to an electronic board according to the present invention.

In FIG. 5A, first guiding means 110 is shown to comprise a first guiding pin 110B provided on the lower tray 200 and a first guiding pin housing 110A provided on the upper tray 100. Both of the first guiding means 110A and 110B are fixed substantially perpendicular to the upper tray 100 and the lower tray 200 respectively, so that when the first guiding pin 110B is aligned with the first guiding housing 110A, the upper tray 100 is aligned with the lower tray 200.

Figure 5B:
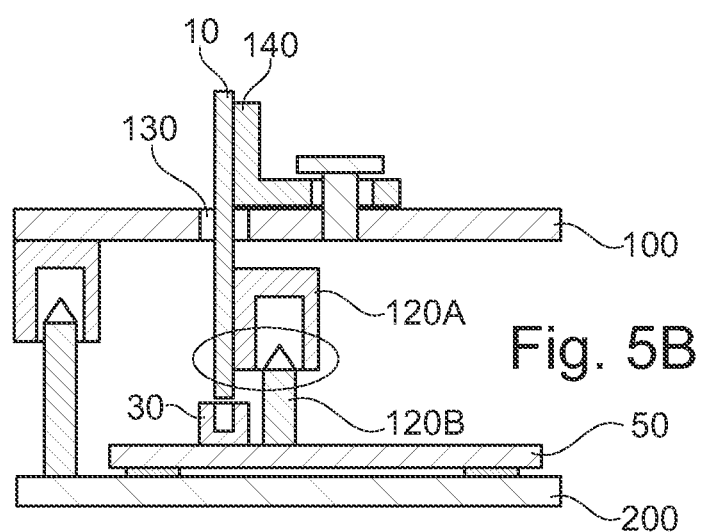

Similarly, as shown in FIG. 5B, second guiding means 120 comprises a second guiding pin 120B provided on and substantially perpendicular to the motherboard 50 and a second guiding pin housing 120A provided on fixed laterally to an vertical card 10, so that the vertical card 10 may be aligned to the motherboard 50. Although not shown in FIGS. 5A-5C, the vertical card 10 may be a riser card, on which an expansion card 17 is extended (to its left in the horizontal direction parallel to the tray 2) perpendicular to the vertical card 10.

The guiding means according to some embodiments of the invention is formed by two components in mutually complementary shape to ease the guiding, i.e. engaging the guiding pin into the guiding pin housing. The guiding pins and guiding pin housing are interchangeable as long as they function the same way. In the exemplary embodiment, guide pin 110B and guide pin housing 110A are on the lower tray 200 and upper tray 100 respectively. In another embodiment of the present invention not shown in the drawing, guiding pin 110B may be provided on the upper tray 100 and guiding pin housing 110A may be provided on the lower tray 200.

It is to be noted that the sequence of the guiding is important. When the upper tray 100 moves downwardly in the vertical direction towards lower tray 200, the first guiding means 110 and the second guiding means 120 are designed such that only after the first guiding means is in engaged position, may the second guiding means be in engaged position. Here, the first guiding means 110 being in engaged position means that the first guiding pin 110B is engaged with the first guiding pin housing 110A. Similarly, the second guiding means 120 being in engaged position means that the second guiding pin 120B is engaged with the second guiding pin housing 120A.

In some further embodiments, after the first guiding means 110 is in engaged position, and before the second guiding means 120 is in engaged position, the vertical card 10 and the second guiding means 120 fixed thereto are free to move together in the horizontal direction.

Such movement being referred to as floating mechanism will be described further with reference to FIG. 6 of the invention. The floating mechanism may allow the vertical card and the second guiding pin housing to self-align with the mating connector and the second guiding pin respectively after the two trays are aligned (the first guiding pin is engaged with the first guiding pin housing), thus further eliminating incorrect connections and damages.

In some further embodiments, each card from a plurality of cards 11, 12, 13, 14 is made to float independently for the easy alignment with motherboard mating connectors (see FIG. 3 of the invention).

In some further embodiments as shown in FIG. 5B, after the first guiding means 110 is in engaged position, during the continuing downward movement, the second guiding means is in engaged position and the vertical card is aligned with the connector 30 but not engaged in yet.

Figure 5C:
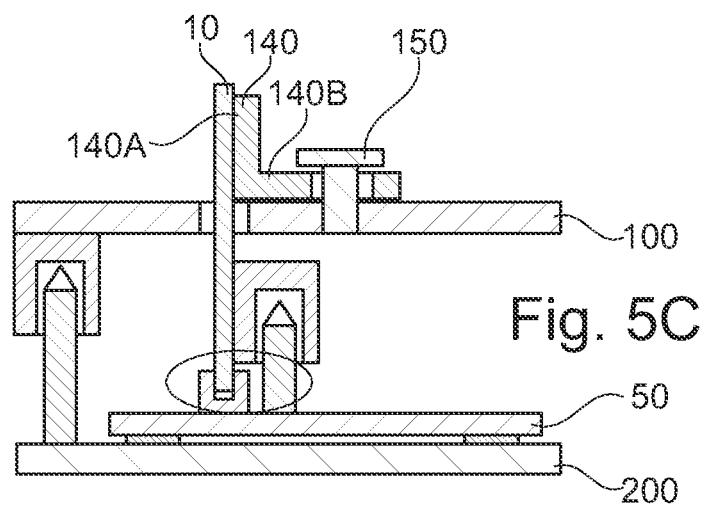

FIG. 5C shows the last step of the self-alignment process where the vertical card 10 is aligned and engaged with the connector 30 of the motherboard 50. The vertical card 10 is in the right position to be plugged in the connector 30.

Now referring to FIGS. 6A-6D, showing detailed configuration of the guiding feature and floating mechanism, as well as the blocking means according to the present invention.

Figure 6A:
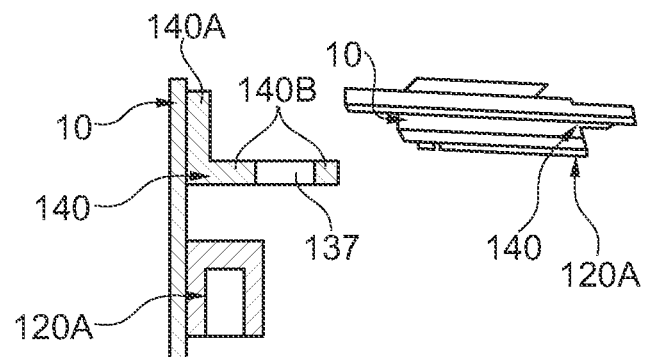
FIGS. 6A-6D show detailed configuration embodying the guiding feature and floating mechanism, as well as the blocking means according to the present invention.

FIG. 6A is a side view schematically showing a vertical card 10 and the components fixed to the card. The drawing on the left is a side view of the various components and the card, the drawing on the right shows the corresponding components and the card in reality.

In some embodiments, the vertical card 10 may be a vertical riser card comprising an upper end and a lower end in the vertical direction. In an exemplary embodiment, the second guiding pin housing 120A is fixed laterally to the lower end of the vertical card 10. Bracket 140 is fixed at the upper end of the vertical card 10. The bracket may be fixed on the same side of the vertical card as the guiding pin housing 120A (as shown in the drawing on the left) or on the opposite side (as shown in the drawing on the right) depending on the configuration of connector and guiding pin on the motherboard that match the vertical card and the guiding pin housing respectively. The bracket 140 may comprise a first part 140A parallel to the vertical card and fixed laterally thereto and a second part 140B extending perpendicularly from the vertical card 10. There is at least one opening 131 on the second part 140B of the bracket.

Figure 6B:
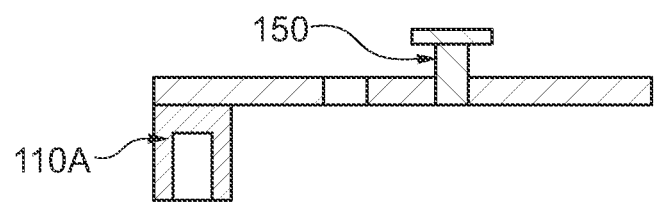

FIG. 6B is a side view schematically showing the upper tray 100 and the components mounted to the upper tray 100. In some embodiments, the first guiding pin housing 110A is fixed underneath perpendicularly to the upper tray 100 and the screw is mounted above also perpendicularly to the upper tray 100.

Figure 6C:
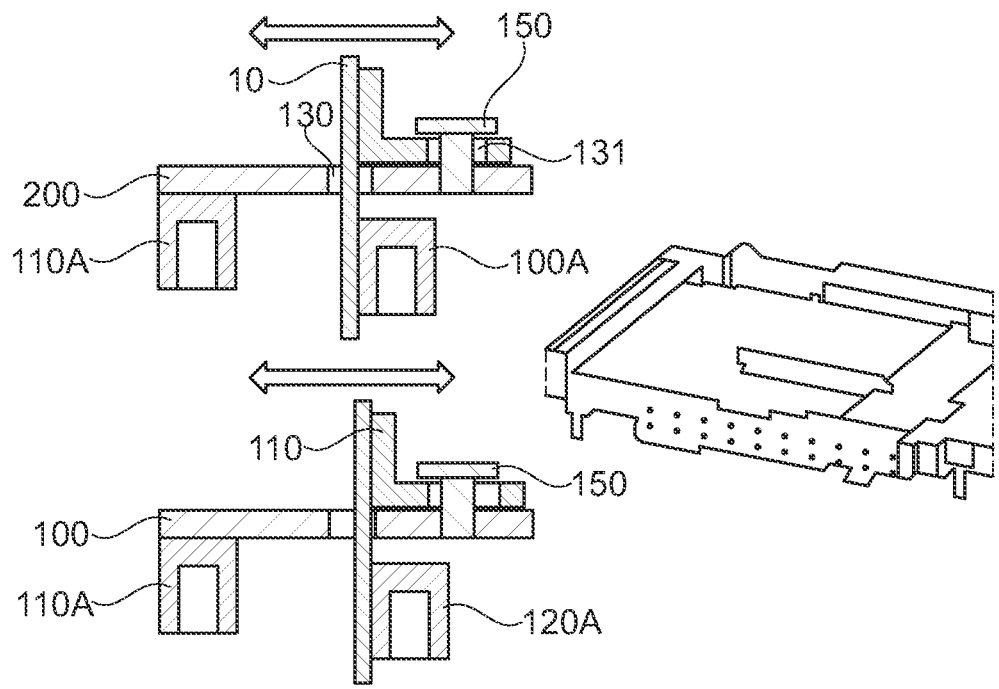

FIG. 6C comprises two side view drawings schematically showing how guiding feature and floating mechanism of vertical card along the upper tray 100 in the horizontal direction are achieved with components of FIG. 6A and FIG. 6B forming the upper tray assembly.

As shown in FIG. 6C, the upper tray 100 assembly further comprises an opening 130 configured for an vertical card 10 to pass through. In an exemplary embodiment, the upper tray assembly is formed by making the vertical card 10 pass through the opening 130 from the space above the upper tray 100, the downward movement is then stopped when the second part 140B of the bracket is seated on the upper tray 100, then the screw 150 passes through the opening 131 of the bracket and then the opening 130 on the upper tray 100 with its head positioned above the second part 140B of the bracket in the vertical position. This assembling configuration allows the vertical vertical card 10 and its bracket 140 to move horizontally along the upper tray 100 with their vertical movement being blocked by the head of the shouldered screw 150.

The second guiding pin housing 120A may then be fixed laterally to the vertical card 10 depending on the relative position of the card and the second guiding means.

The two drawings of FIG. 6C show the position change in the horizontal direction of the vertical card 10 in relation to the upper tray 100. After the upper tray 100 is engaged with the lower tray 200 by the first guiding means, and before the vertical card is engaged with the connector on the motherboard, the vertical card can thus move freely with respect to the lower tray 200 due to the above-explained floating mechanism.

Figure 6D:
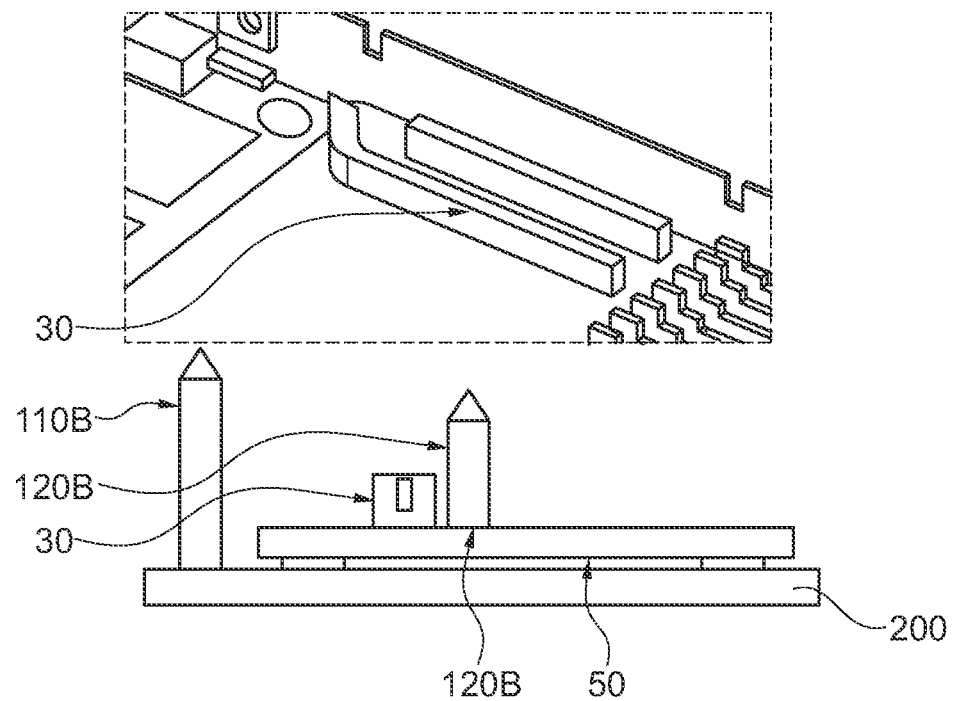

FIG. 6D is a side view showing the components forming the lower tray 200 assembly, wherein the connector housing 30 and the second guiding pin housing 120B are mounted on the motherboard 50, the motherboard 50 is mounted on the lower tray 200, with a first guiding pin 110B being also mounted on the lower tray 200 situated next to the motherboard 50.

Figure 7:
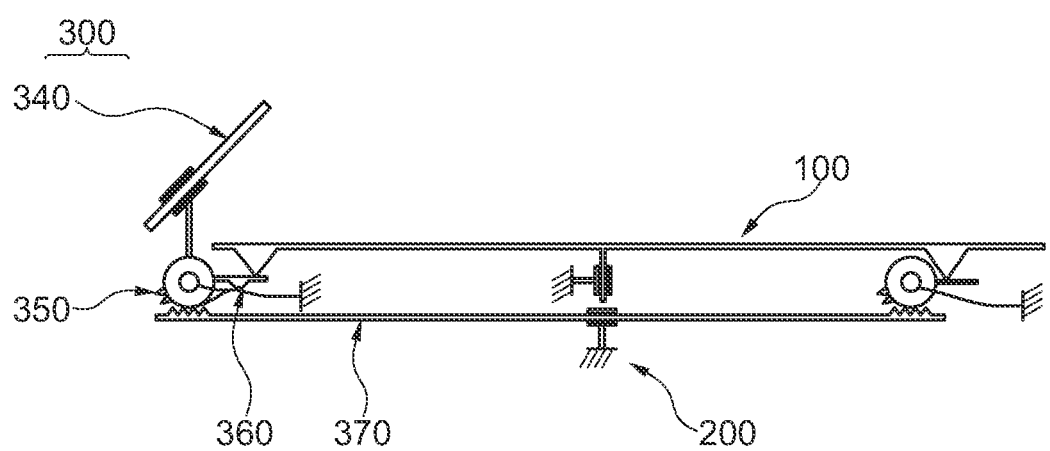
FIG. 7 is a side view of the system showing the principle of the ejection mechanism.

FIG. 7 is a side view of the system showing the principle of the ejection mechanism.

In a preferred embodiment, the present invention enabled by the ejection mechanism allows the upper tray 100 to be ejected from the lower tray 200 by one operator.

In an exemplary embodiment, the ejecting means 300 comprises an effort reduction system, comprising four gears 350A, 350B, 350C, 350D, two levers 340A, 340B, four fingers 360A, 360B, 360C, 360D each being rigidly connected to the respective gear and disposed under the upper tray 100. The number of gears, lever and fingers can vary depending on the design need.

Referring to FIG. 7, the actuation of a lever by the operator may activate a first gear 350A of a set of two gears linked to the lever 340A to start to rotate. Such rotation is transmitted by a slider 370 to a second gear 340B located along the same side of the first gear 340A of the lower tray 200. There are two fingers 360A, 360B fixed respectively to the two gears, the rotation of the gears produces upward force on the fingers which then "pull up" the upper tray 100 upwardly on one side of the tray. It is to be understood, one lever corresponding to two gears linked two by two can lift up one side of the upper tray 100, thus two levers are needed to lift up the two opposite sides of the upper tray 100, i.e. the entire upper tray 100. Such two levers may be operated by two hands of one operator, thus providing the facility to operation by a single operator.

The principle of the ejecting mechanism as explained previously enables an effort reduction effect where the displacement of the at least one lever is greater than the course of the fingers in the vertical direction so as to lift the upper tray 100 such that the first effort of the displacement of the levers is weaker than the second effort of the vertical movement of the fingers so as to lift the first supporting means. In other words, the levers of the effort reduction system help to increase the pull-up force of the operator.

Figure 8A:
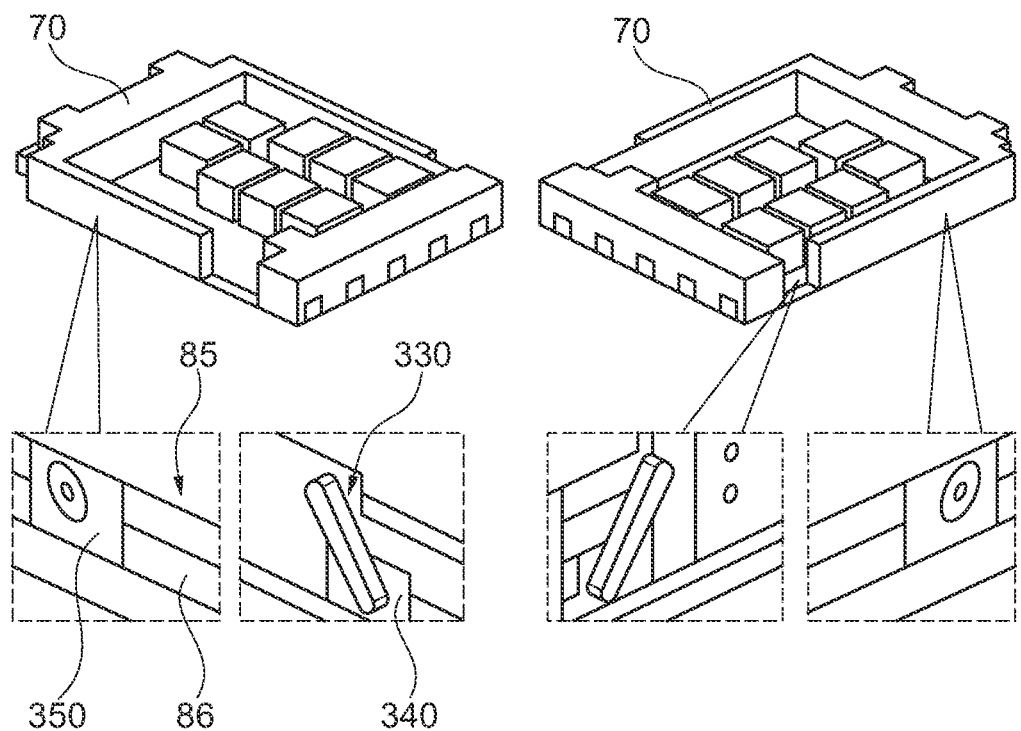
FIG. 8A-8B show the main components used in the ejection mechanism in the left horizontal view and right horizontal view of the system and the close-up diagrams of the respective components according to the present invention.
Figure 8B:
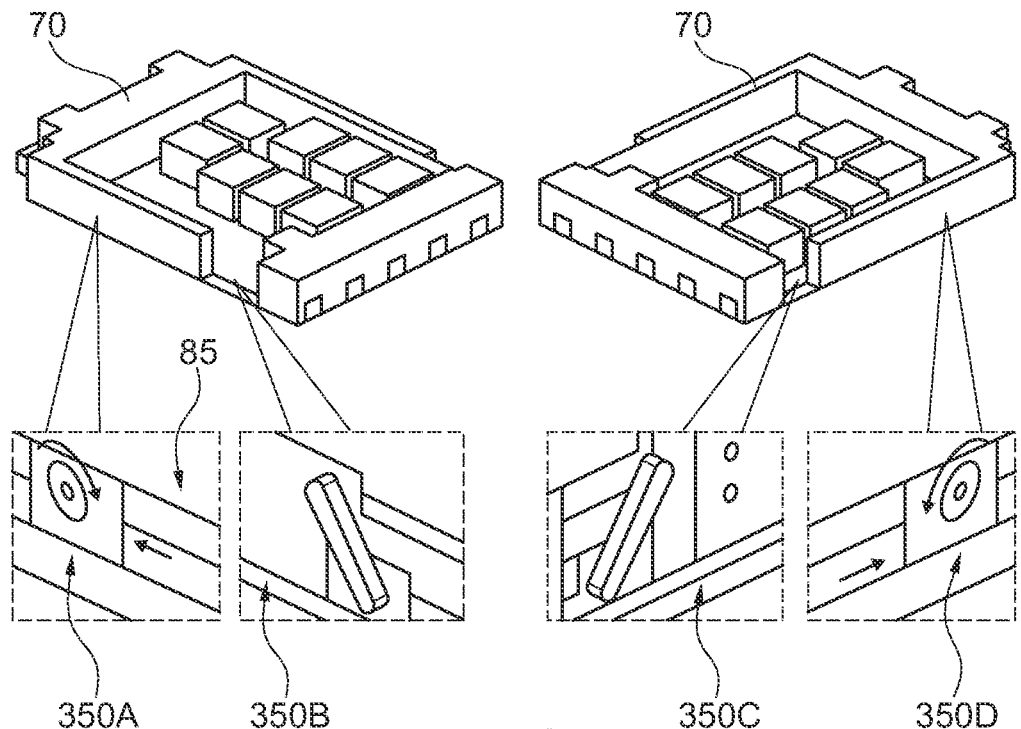

FIG. 8A-8B show the main components used in the ejection mechanism in the left horizontal view and right horizontal view of the system and the close-up diagrams of the respective components according to the present invention.

An objective of the present invention is to ensure correct connection between the vertical card and the motherboard. This includes rigidity of mechanism, mechanism stopper to optimize the gaps and locking for the vertical cards during mated condition.

This is to be now explained with reference to FIG. 8A and FIG. 8B. In some preferred embodiments, the four gears 350 are toothed gears, divided into two sets with each set being located on one lateral side of the upper tray 100 respectively seen for example in the left horizontal view and right horizontal view of the computer box. Two gears of the same set rotate simultaneously when being activated by the movement of one lever by the operator. It is seen in FIG. 8B that the four gears 350A, 350B, 350C, 350D form four ejection points of the ejecting mechanism. FIGS. 8A and 8B also show in detail a tray lifter bracket 85 and a connecting plate 86 (not shown in FIG. 8B).

Essentially, the four ejecting points formed by four gears are located substantially at the four corners of the upper tray 100 in order to keep the ejection force between the gears and to make sure that the upper tray 100 stays stable and parallel to the lower tray 200 during the injection and the insertion thus assuring correct connection and disconnection to eliminate the risk of damaging the connectors and/or the vertical cards. Such a configuration may also insure certain flexibilities on the equipment to be mounted in the upper tray 100 as no mechanical modification on the ejection mechanism will become available despite of any change of the centre of mass of the upper tray 100 due to the potential change of the position of the cards. Once the ejecting mechanism is conceived, it will not be updated in view of the gears, fingers or the levers; However, the motherboard may be subject to modifications in view of the different connector locations.

For the same purpose, both the lower tray 200 and upper tray 100 are preferably of quadrilateral shape.

Furthermore, to avoid increasing the size of the server including the ejecting means 300, it is proposed a tractable lever by the present invention.

It is to be understood by a person skilled in the art that although the ejection mechanism has shown applicable with the levers, gears, fingers and sliders mounted on the lower tray 200, alternative application of the ejecting mechanism is conceivable to be mounted on the upper tray 200. In the alternative example, the ejecting mechanism provided on the upper tray 200 is configured to push the lower tray 100 away from the upper tray 200.

It is to be noted that although only manually actuated levers are demonstrated in some embodiments, the levers can also be conceived as electric levers. In another embodiment of the invention, the system may comprise four electric actuators instead of two levers. Further, in another embodiment of the invention, two levers are linked to increase the smoothness of the mechanism.

Figure 9:
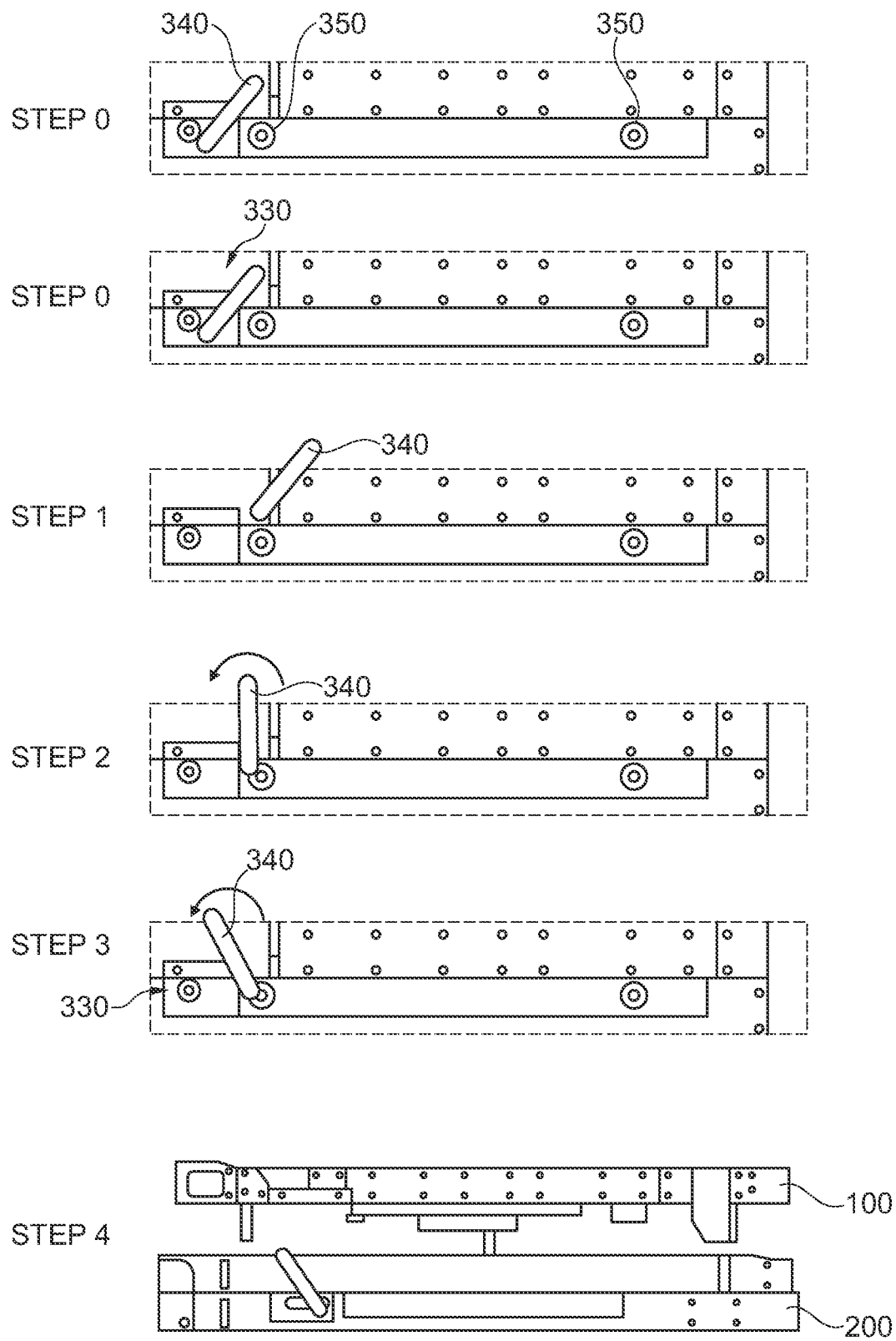
FIG. 9 are side views of the system schematically showing the process for ejecting the upper tray from the lower tray manually by an operator.
Figure 10A:
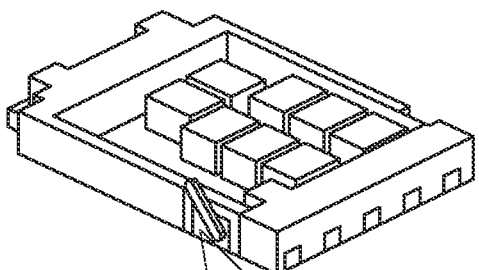
FIGS. 10A and 10B schematically illustrate the ordered sequence (steps 1-3 are shown in FIG. 10A, step 4 is shown in FIG. 10B) of using the plunger and lever according to the ejection mechanism of the present invention.
Figure 10A:
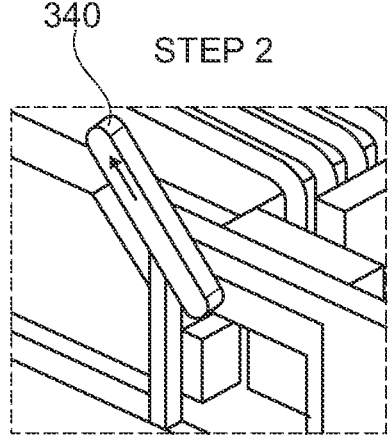
Figure 10A:
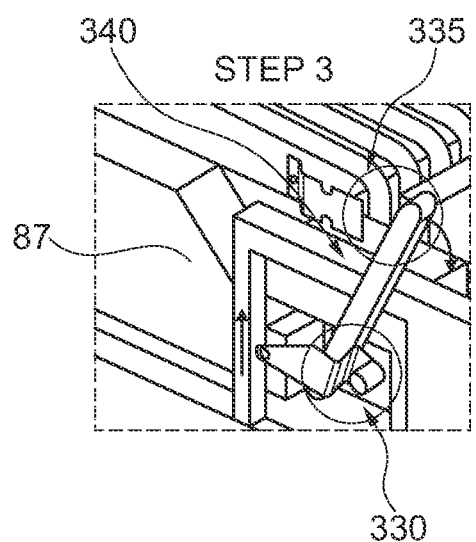
Figure 10B:
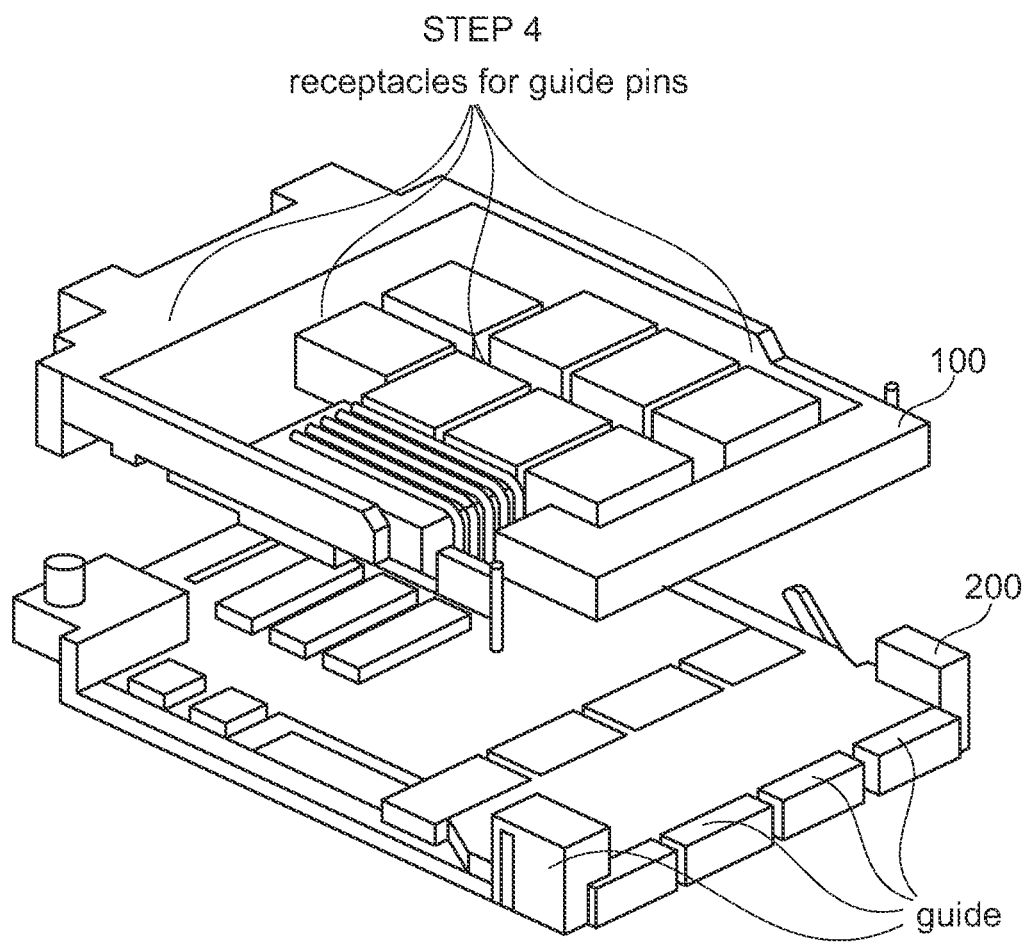

Both FIGS. 9 and 10A and B describes the ordered sequence for carrying out the ejection mechanism with the functioning of a lever 340 and a plunger 330. FIG. 9 are side views of the system schematically showing the process for ejecting upper tray 100 from lower tray 200 manually by an operator. FIGS. 10A and B schematically illustrates the ordered sequence with closed-up diagrams of certain components to explain their functionality to achieve the ejection mechanism.

In the following descriptions, similar steps having been illustrated with reference to FIGS. 8A-8B will be omitted here, the focus is given to the explanations about the functioning of the plunger 330 and the lever 340.

Referring to FIG. 9, at Step 0, the upper tray 100 is in an inserted position in the lower tray 200. At Step 1, the plunger 330 (marked out with a "star") is pulled out. It is to be noted that the plunger used here is one type of latch, which may be driven by a spring to release stoppages. In this example, pulling out the plunger 330 allows the rotation of the lever 340. At Step 2, the lever 340 is pulled up in the direction as shown by the arrow. At Step 3, after the lever 340 is pulled and passes a point for rotation (see Procedure-1 of FIG. 10A), then it can rotate for example in anti-clockwise direction in the plane formed by the lateral side of the trays until the plunger is locked again (see the position of the plunger 330 marked out by a "star"). The rotation of the lever causes the gears linked by the slider to rotate simultaneously thus pulling of the upper tray 100. Consequently, the vertical cards or other optional equipment 40 on the upper tray 100 are plugged out from the lower tray 200. At Step 4, the upper tray 100 is pulled with hand from the lower tray 200.

It is to be noted that, the functioning of only one lever is demonstrated above. To be able to implement the present invention, the above steps need to be implemented on both of levers (on the left and right of the computer box 70 as shown in FIG. 8A-8B) simultaneously. It is also to be noted that the operation of both levers requires that an operator handle the above steps simultaneously with two hands.

Now referring to FIGS. 10A and B showing the procedures for ejecting the upper tray 100 from the lower tray 200. At step 1, as seen in the closed-up diagram of the left lateral side of the computer box, the plunger 330 is first pulled out, then, keeping the plunger 330 in pulled condition, the lever 340 is tilted clockwise to unlock the lever 340 or the plunger is pulled to unlock the lever for rotation. At step 2, the lever is lifted in the upward direction following the arrow in the drawing. At step 3, the lever is rotated in clockwise direction using the thumb space 335 until the upper tray 100 is ejected completely from the lower tray 200. Then the plunger 330 is locked automatically within the hole (blocked by the plunger 330 and cannot be seen in the drawing) provided in the lower tray 200. A lifter plate 87 is shown in view of the upward movement (shown as upward arrow) At step 4, upper tray 100 is lifted upwardly and placed aside for example on a table.

Access to the motherboard on lower tray 200 is available now. Next, the same steps in a reversed order can be applied to implement the insertion mechanism to insert upper tray 100 back onto the lower tray 200. It is to be noted that four guiding pins on are shown to guide the upper tray 100 properly with the lower tray 200.

Figure 11A:
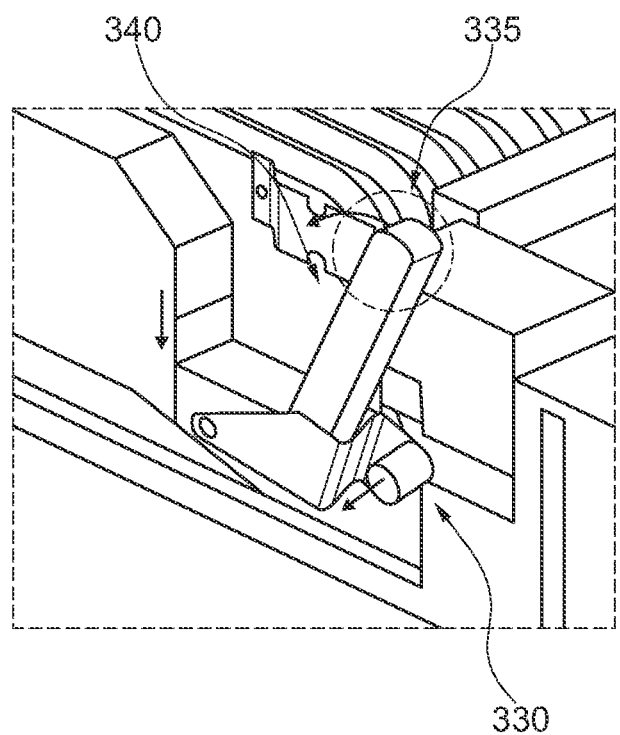
FIGS. 11A-11B schematically illustrate the functioning of the locking system in the insertion mechanism of the present invention.
Figure 11B:
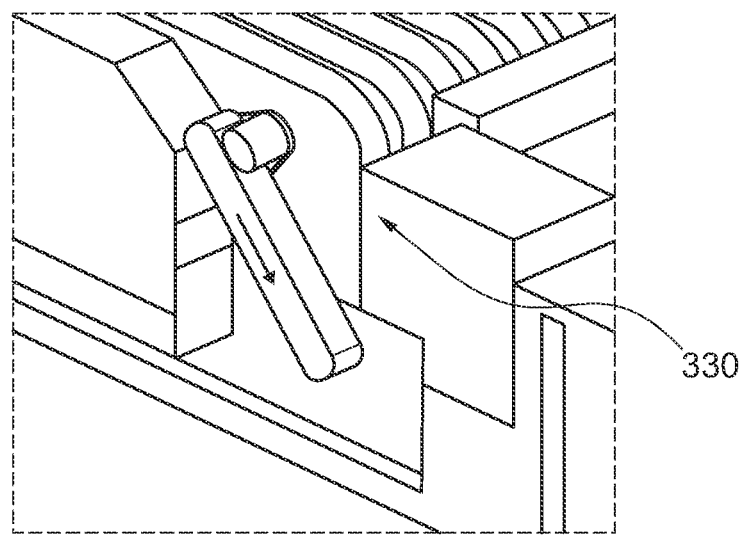

FIGS. 11A-11B schematically illustrate how the locking system functions in the insertion mechanism of the present invention.

FIGS. 11A-11B demonstrate during the procedure of insertion, reversed to the ejecting explained above with reference to FIGS. 9 and 10 how the functioning of the locking system can further assure the correct connections between the vertical cards and the motherboard.

Referring to FIG. 11A, once the upper tray 100 is completely engaged with the lower tray 200, the plunger 330 can be pulled out to unlock the lever so that the lever 340 can be rotated to connect the vertical cards with the motherboard.

In some preferred embodiments, the plunger may be automatically locked with the upper tray 100 once the upper tray 100 is completely connected to the lower tray 200.

Referring to FIG. 11B, the lever 340 may automatically slide down due to gravity and be seated in the lever room area.

Figure 12A:
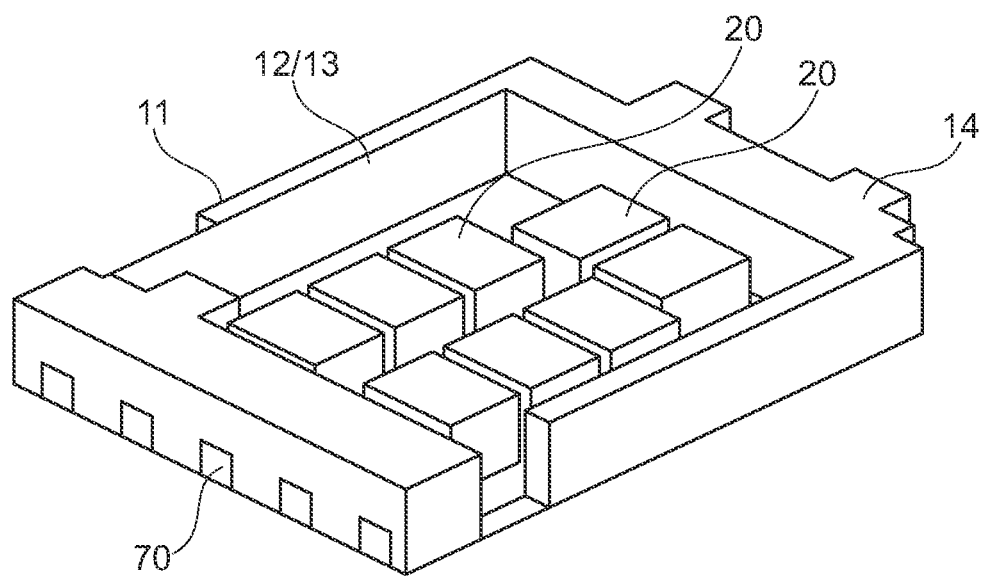
FIG. 12A shows an upper tray with some applications of the vertical cards.
Figure 12B:
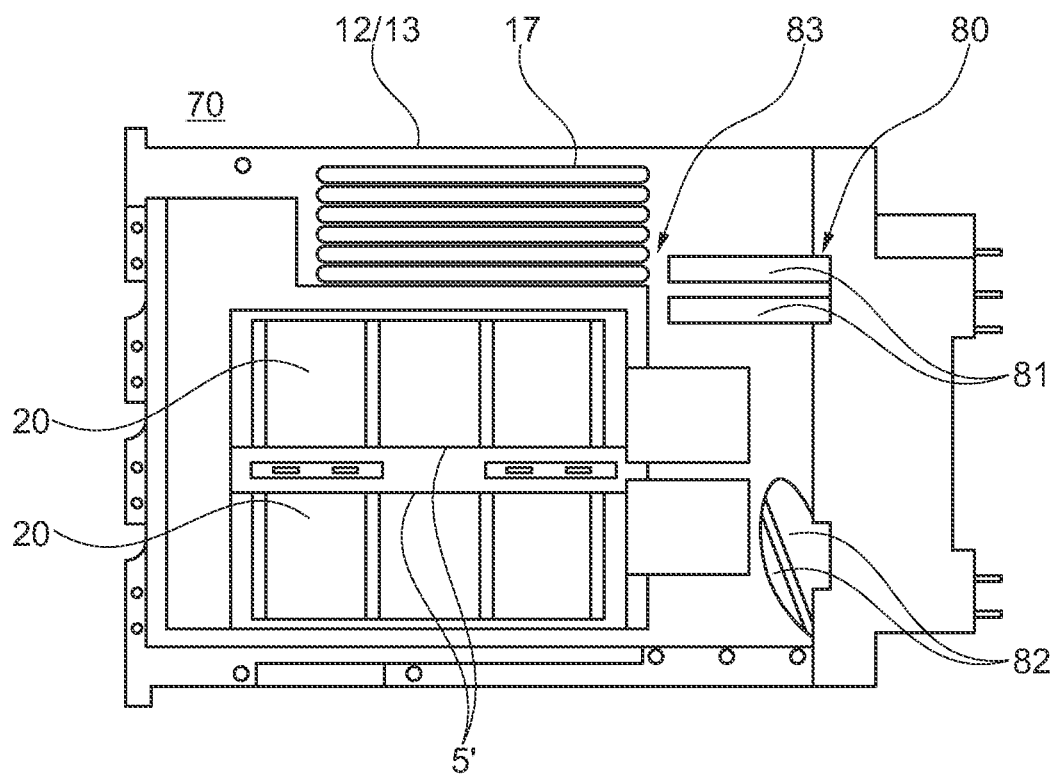
FIG. 12B shows some applications of the vertical cards and some applications of the horizontal cards and some cables.

FIGS. 12A-12B shows upper tray in the form of a computer box 70.

Referring to FIG. 12A, which shows a computer box 70 with disk array 20 and several power riser cards. It is to be noted that the disk array 20 may be an array of several hard disks mounted directly on the vertical cards.

Referring to FIG. 12B showing the top view of the computer box 70. Apart from disk array 20 as explained above, there are vertical cards such as PCIe riser cards 12, 13 as well as horizontal cards such as standard PCIe card 17, inserted perpendicular to the vertical card and extends in the horizontal direction parallel to the plane of the upper tray. FIG. 12B also demonstrates disk backplanes 5', E-chain 80, cable entry 81, cable exit 82 and cables 83 from PCIe card routed through E-chain 80 and connected to disk backplanes 5'.

In one exemplary but not limitative embodiment, the power riser card 11 on the left has a mating force of 10.5 kg and an unmating force of 5.25 kg; the power riser card 14 on the right has the same mating and unmating forces respectively. The PCIe riser card 12/13 has a mating force of 7.5 kg and an unmating force of 3.75 kg. The weight of the disk array 20 is approximately 8.7 kg.

Figure 13:
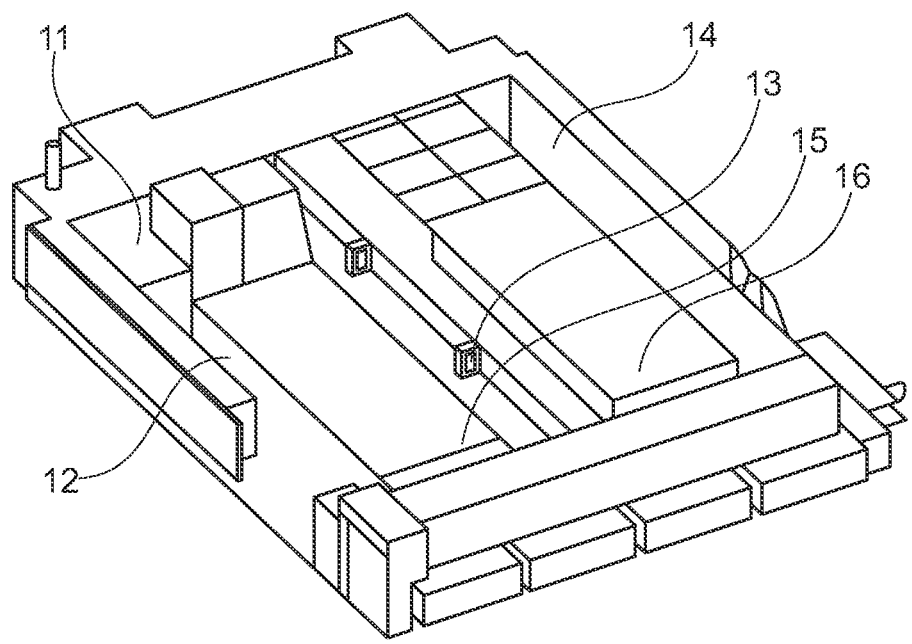
FIG. 13 schematically illustrates a view of the upper tray in the form of a computer box 70 with vertical card multiple connectivity and compatibility between the mother board and standard PCIe card.

FIG. 13 schematically illustrates a system for connecting at least one vertical card to a plurality of electronic boards (not shown) according to another embodiment of the present invention.

In FIG. 13, two graphic cards 15 and 16 are mounted on the upper tray 100 directly on the vertical cards (not shown), together with four vertical cards including power riser cards 11 and 14, and PCI riser cards 12 and 13.

The invention has been described with reference to preferred embodiments. However, many variations are possible within the scope of the invention. For instance, The embodiments described in the foregoing disclosure are presented as examples. The scope of the present invention is to be limited only by the following claims.

The invention claimed is:

1. A system for connecting at least one electronic card (10) to an electronic board (50) of a computer device comprising:
   an electronic board (50), equipped with a plurality of connectors (30) for connecting at least one electronic card (10) to the electronic board (50), and slots (24) for connecting at least one components to the electronic board (50);
   an opening 130 on a first supporting means configured to let the electronic card 10 to pass through;
   a bracket (140), a first part (140A) of the bracket being fixed laterally to the electronic card (10), a second part (140B) of the bracket extends perpendicularly from the electronic card and after the electronic card passes through the opening 130 and when the second part (140B) is seated on the first supporting means 100, the vertical movement of the second part (140B) of the bracket (140) is blocked with respect to the first supporting means (100) by a blocking means (150);
   wherein said at least one electronic card (10) are substantially perpendicular to the electronic board (50), the computer device further comprises a system for connecting being configured such that all electronic cards are connected to the electronic board (50) simultaneously via the system for connecting.

2. The system for connecting according to claim 1, wherein the first supporting means (100) is configured such that for connecting the at least one electronic card (10) to said electronic board (50), said at least one electronic card (10) is first mounted onto the first supporting means (100), before the first supporting means (100) is placed above the electronic board (50) in the vertical direction, the system further comprising a second supporting means (200) installed underneath the electronic board (50) in the vertical direction.

3. The system for connecting according to claim 2, wherein the second supporting means (200) further comprises an ejecting means (300) configured for lifting the first supporting means (100) from the second supporting means (200).

4. The system for connecting according to claim 3, wherein the ejecting means (300) comprises an effort reduction system, comprising a plurality of gears (350), at least one lever (340), a plurality of fingers (360) being rigidly connected to the gears (350) and disposed under the first supporting means (100), wherein the displacement of the at least one lever (340) is greater than the course of the finger (360) in the vertical direction so as to lift the first supporting means (100) such that the first effort of the displacement of the levers (340) is weaker than the second effort of the vertical movement of the fingers (360) so as to lift the first supporting means (100).

5. The system for connecting according to claim 3, wherein the ejecting means (300) comprises four gears and two levers, both the first and second supporting means are of quadrilateral shape, said four gears are located at the four corners of the second supporting means.

6. The system for connecting according to claim 5, wherein the four gears are toothed gears, divided into two sets each set being located on one lateral side of the second supporting means, the two gears of each set are linked by a slider so that when one gear of each set is activated by a lever, two gears of the same set rotate simultaneously.

7. The system for connecting according to claim 3, wherein the ejecting means (300) further comprises a locking system configured to authorize a lever to be unlocked once the first supporting means (100) is completely engaged with the second supporting means (200) so that the lever can be rotated to connect the at least one electronic cards with the electronic board.

8. The system for connecting according to claim 7, wherein the locking system comprises a plunger (330) configured to be pulled out once the first supporting means (100) is completely engaged with the second supporting means (200), allowing the lever to be unlocked.

9. The system for connecting according to claim 1, wherein the system further comprises at least two guiding means (110A, 110B, 120A, 120B), provided in mutually complementary shape, so that the at least one electronic card (10) is guided to align with the connectors (30) of the electronic board (50) before the card (10) is plugged into the connectors of the electronic board.

10. The system for connecting according to claim 9, wherein the at least one guiding means (110A, 110B, 20A, 120B, 10, 30) comprises a first guiding means (110), comprising a first guiding pin (110B) and a first guiding pin housing (110A), each first guiding means (110A, 110B) being provided on the first supporting means (100) and on the second supporting means (200) respectively, each of the first guiding means being fixed perpendicular to one of the supporting means, so that when one of the first guiding means (110A, 110B) provided on the first supporting means (100) is aligned with the other first guiding means provided on the second supporting means (200), the first supporting means (100) is aligned with the second supporting means (200) in a horizontal direction, the horizontal direction being parallel to the electronic board.

11. The system for connecting according to claim 9, wherein the at least one guiding means further comprises a second guiding means (120), comprising a guiding pin (120B) and guiding pin housing (120A), one of the second guiding means (120A, 120B) being provided on the electrical card (10) and fixed laterally to the electronic card (10), and the other second guiding means (120A, 120B) being provided on the electronic board (50) and being fixed perpendicular to the electronic board, so that one of the second guiding means (120A, 120B) fixed to the electronic card (10) is guided to align with the other second guiding means (120A, 120B) on the electronic board (50), and the electronic card (10) is aligned with the connectors (30) of the electronic board (50).

12. The system for connecting according to claim 9, wherein the at least one guiding means comprises a first guiding means and a second guiding means, where the first guiding means (110) and the second guiding means (120) are configured so that the second guiding means (120) is in engaged position only after the first guiding means (110) is in engaged position.

13. The system for connecting according to claim 9, wherein the at least one guiding means comprises a first guiding means and a second guiding means, where after the first guiding means (110) is in engaged position and before the second guiding means (120) is in engaged position, the electronic card (10) and second guiding means fixed thereto are free to move together in a horizontal direction, the horizontal direction being parallel to the electronic board.

14. The system for connecting according to claim 1, wherein the blocking means is a shouldered screw being configured that when being screwed into the first supporting means (100), the vertical movement of the second part (140B) of the bracket (140) is blocked between the head of the shouldered screw (150) and the first supporting means (100).

15. The system for connecting according to claim 1, wherein the electronic cards may be riser cards used for inserting horizontal cards being perpendicular to the vertical cards.

16. The system for connecting according to claim 1, wherein the computer device comprises a plurality of electronic boards, and a system for connecting being configured such that the at least one electronic card is connected to the plurality of electronic board simultaneously via the system for connecting.

17. A system for connecting at least one electronic card to the electronic board of a computer device according to claim 1, wherein the electronic board is motherboard.

18. A method for connecting at least one electronic card to an electronic board of a computer device according to claim 1, comprises connecting all electronic cards to the electronic board simultaneously via the system for connecting.

19. The method for connecting according to claim 18, comprises the steps of: mounting at least one electronic card onto a first supporting means, and then placing the first supporting means above the electronic board in the vertical direction, wherein a second supporting means is installed underneath the electronic board (50) in the vertical direction.

20. The method for connecting according to claim 19, wherein the step of placing comprises the step of guiding the at least one electronic card to align with the connectors of the electronic board before plugging the electronic card into the connectors of the electronic board.

21. The method for connecting according to claim 20, wherein the step of guiding further comprises performing a second guiding step performed by the second guiding means after a first guiding step is performed with the first guiding means.

22. The method for connecting according to claim 21, wherein the first guiding step allows the first supporting means to be aligned with the second supporting means in a horizontal direction when the first guiding means is in engaged position, and the second guiding step allows the electronic card to be aligned with the electronic board when the second guiding means is in engaged position, the horizontal direction being parallel to the electronic board.

23. The method for connecting according to claim 18, further comprises the step of moving the electronic card with respect to the electronic board in a horizontal direction after the first guiding step so that the electronic card is aligned with a connector on the electronic board (50), the horizontal direction being parallel to the electronic board.

24. The method for connecting according to claim 23, wherein the method comprises installing a blocking means (150) on the first supporting means after the electronic card and a bracket (140) is mounted on the first supporting means, so that the vertical movement of the electronic card and the bracket (140) is blocked by the blocking means (150).

25. The method for connecting according to claim 24, further comprises lifting the first supporting means (100) from the second supporting means (200) by an ejecting means (300).

* * * * *

UNITED STATES PATENT AND TRADEMARK OFFICE
CERTIFICATE OF CORRECTION

PATENT NO. : 11,596,078 B2
APPLICATION NO. : 16/956635
DATED : February 28, 2023
INVENTOR(S) : Luc Dallaserra and Jithendra Bangera It is certified that error appears in the above-identified patent and that said Letters Patent is hereby corrected as shown below:

In the Claims

Column 14, Line 43, Claim 3, the claim reference numeral '2' should read -1-.

Column 14, Lines 44-47, Claim 3, cancel the text beginning with "second supporting means (200)" to and ending with "from the second supporting means (200)." Replace the cancelled text with the following:
system further comprises at least two guiding means (110A, 110B, 120A, 120B), provided in mutually complementary shape, so that the at least one electronic card (10) is guided to align with the connectors (30) of the electronic board (50) before the card (10) is plugged into the connectors of the electronic board.

Column 14, Lines 49-59, Claim 4, cancel the text beginning with "ejecting means (300)" to and ending with "lift the first supporting means (100)." Replace the cancelled text with the following:
at least one guiding means (110A, 110B, 20A, 120B, 10, 30) comprises a first guiding means (110), comprising a first guiding pin (110B) and a first guiding pin housing (110A), each first guiding means (110A, 110B) being provided on the first supporting means (100) and on the second supporting means (200) respectively, each of the first guiding means being fixed perpendicular to one of the supporting means, so that when one of the first guiding means (110A, 110B) provided on the first supporting means (100) is aligned with the other first guiding means provided on the second supporting means (200), the first supporting means (100) is aligned with the second supporting means (200) in a horizontal direction, the horizontal direction being parallel to the electronic board.

Column 14, Lines 61-64, Claim 5, cancel the text beginning with "ejecting means (300) comprises" to and ending with "of the second supporting means." Replace the cancelled text with the following:
at least one guiding means further comprises a second guiding means (120), comprising a guiding pin (120B) and guiding pin housing (120A), one of the second guiding means (120A, 120B) being provided on the electrical card (10) and fixed laterally to the electronic card (10), and the other second guiding means (120A, 120B) being provided on the electronic board (50) and being fixed perpendicular to the electronic board, so that one of the second guiding means (120A, 120B) fixed to Signed and Sealed this
Twenty-seventh Day of August, 2024

*Katherine Kelly Vidal*
*Director of the United States Patent and Trademark Office*

CERTIFICATE OF CORRECTION (continued)
U.S. Pat. No. 11,596,078 B2 the electronic card (10) is guided to align with the other second guiding means (120A, 120B) on the electronic board (50), and the electronic card (10) is aligned with the connectors (30) of the electronic board (50).

Column 14, Lines 66-67 through Column 15, Lines 1-3, Claim 6, cancel the text beginning with "four gears are toothed gears" to and ending with "same set rotate simultaneously." Replace the cancelled text with the following:
at least one guiding means comprises a first guiding means and a second guiding means, where the first guiding means (110) and the second guiding means (120) are configured so that the second guiding means (120) is in engaged position only after the first guiding means (110) is in engaged position.

Column 15, Lines 5-10, Claim 6, cancel the text beginning with "ejecting means (300) further" to and ending with "with the electronic board." Replace the cancelled text with the following:
at least one guiding means comprises a first guiding means and a second guiding means, where after the first guiding means (110) is in engaged position and before the second guiding means (120) is in engaged position, the electronic card (10) and second guiding means fixed thereto are free to move together in a horizontal direction, the horizontal direction being parallel to the electronic board.

Column 15, Line 11, Claim 8, the claim reference numeral '7' should read -1-.

Column 15, Lines 12-15, Claim 8, cancel the text beginning with "locking system comprises" to and ending with "lever to be unlocked." Replace the cancelled text with the following:
blocking means is a shouldered screw being configured that when being screwed into the first supporting means (100), the vertical movement of the second part (140B) of the bracket (140) is blocked between the head of the shouldered screw (150) and the first supporting means (100).

Column 15, Line 16, Claim 9, the claim reference numeral '1' should read -2-.

Column 15, Lines 17-22, Claim 9, cancel the text beginning with "system further comprises" to and ending with "connectors of the electronic board." Replace the cancelled text with the following:
second supporting means (200) further comprises an ejecting means (300) configured for lifting the first supporting means (100) from the second supporting means (200).

Column 15, Line 23, Claim 10, the claim reference numeral '9' should read -10-.

Column 15, Lines 24-37, Claim 10, cancel the text beginning with "at least one guiding means" to and ending with "parallel to the electronic board." Replace the cancelled text with the following:
ejecting means (300) comprises an effort reduction system, comprising a plurality of gears (350), at least one lever (340), a plurality of fingers (360) being rigidly connected to the gears (350) and disposed under the first supporting means (100), wherein the displacement of the at least one lever (340) is greater than the course of the finger (360) in the vertical direction so as to lift the first supporting means (100) such that the first effort of the displacement of the levers (340) is weaker than the second effort of the vertical movement of the fingers (360) so as to lift the first supporting means (100).

CERTIFICATE OF CORRECTION (continued)
U.S. Pat. No. 11,596,078 B2

Column 15, Line 38, Claim 11, the claim reference numeral '9' should read -10-.

Column 15, Lines 39-52, Claim 11, cancel the text beginning with "at least one guiding means" to and ending with "of the electronic board (50)." Replace the cancelled text with the following:
ejecting means (300) comprises four gears and two levers, both the first and second supporting means are of quadrilateral shape, said four gears are located at the four corners of the second supporting means.

Column 15, Lines 53-58, Claim 12, cancel the text beginning with "at least one guiding means" to and ending with "is in engaged position." Replace the cancelled text with the following:
four gears are toothed gears, divided into two sets each set being located on one lateral side of the second supporting means, the two gears of each set are linked by a slider so that when one gear of each set is activated by a lever, two gears of the same set rotate simultaneously.

Column 15, Line 59, Claim 13, the claim reference numeral '9' should read -10-.

Column 15, Lines 60-66, Claim 13, cancel the text beginning with "at least one guiding means" to and ending with "parallel to the electronic board." Replace the cancelled text with the following:
ejecting means (300) further comprises a locking system configured to authorize a lever to be unlocked once the first supporting means (100) is completely engaged with the second supporting means (200) so that the lever can be rotated to connect the at least one electronic cards with the electronic board.

Column 16, Lines 2-7, Claim 14, cancel the text beginning with "blocking means is a" to and ending with "the first supporting means (100)." Replace the cancelled text with the following:
the locking system comprises a plunger (330) configured to be pulled out once the first supporting means (100) is completely engaged with the second supporting means (200), allowing the lever to be unlocked.